(12) United States Patent
Sato et al.

(10) Patent No.: US 8,828,304 B2
(45) Date of Patent: Sep. 9, 2014

(54) METHOD OF FORMING RESIST PATTERN BY NANOIMPRINT LITHOGRAPHY

(75) Inventors: Kazufumi Sato, Kanagawa (JP); Tomotaka Yamada, Kanagawa (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 115 days.

(21) Appl. No.: 12/303,434

(22) PCT Filed: May 30, 2007

(86) PCT No.: PCT/JP2007/060956
§ 371 (c)(1), (2), (4) Date: Dec. 4, 2008

(87) PCT Pub. No.: WO2007/142088
PCT Pub. Date: Dec. 13, 2007

(65) Prior Publication Data
US 2009/0189317 A1    Jul. 30, 2009

(30) Foreign Application Priority Data
Jun. 7, 2006   (JP) ................................. 2006-158894

(51) Int. Cl.
| | | |
|---|---|---|
| *B29C 59/02* | (2006.01) | |
| *B29C 71/04* | (2006.01) | |
| *G03F 7/00* | (2006.01) | |
| *G03F 7/038* | (2006.01) | |
| *G03F 7/075* | (2006.01) | |
| *B82Y 40/00* | (2011.01) | |
| *B82Y 10/00* | (2011.01) | |
| *B29K 85/00* | (2006.01) | |
| *B29C 35/08* | (2006.01) | |

(52) U.S. Cl.
CPC ............ *B29C 59/026* (2013.01); *G03F 7/0002* (2013.01); *G03F 7/0382* (2013.01); *B29C 71/04* (2013.01); *G03F 7/0757* (2013.01); *B29K 2085/00* (2013.01); *B82Y 40/00* (2013.01); *B29C 2035/0827* (2013.01); *B82Y 10/00* (2013.01); *Y10S 977/887* (2013.01)
USPC ........... 264/447; 264/319; 264/293; 977/887; 216/49

(58) Field of Classification Search
None
See application file for complete search history.

(56) References Cited

U.S. PATENT DOCUMENTS

| | | |
|---|---|---|
| 6,258,732 B1 * | 7/2001 | Lin et al. ........................ 438/780 |
| 2005/0202350 A1 * | 9/2005 | Colburn et al. ............... 430/320 |
| 2005/0221225 A1 * | 10/2005 | Kawana et al. ............ 430/270.1 |

FOREIGN PATENT DOCUMENTS

| | | |
|---|---|---|
| JP | 2002-093748 A | 3/2002 |
| JP | 2002-184719 A | 6/2002 |

(Continued)

OTHER PUBLICATIONS

Xing Cheng et al, "Combined Nanoimprint-and-Photolithography Technique with a Hybrid Mold", Proceedings of SPIE, vol. 5374, pp. 337-347, 2004.

(Continued)

*Primary Examiner* — Benjamin Schiffman
(74) *Attorney, Agent, or Firm* — Knobbe Martens Olson & Bear LLP

(57) ABSTRACT

A method of forming a resist pattern of high aspect ratio excelling in etching resistance by the use of nanoimprint lithography. The method of forming a resist pattern by nanoimprint lithography comprises the steps of disposing organic layer (4) on support (1); providing resist layer (2) on the organic layer (4) with the use of chemical amplification type negative resist composition containing silsesquioxane resin (A); pressing light transmission allowing mold (3) with partial light shielding portion (5) against the resist layer (2) and thereafter carrying out exposure from the upside of the mold (3); and detaching the mold (3).

3 Claims, 1 Drawing Sheet

(56) References Cited

FOREIGN PATENT DOCUMENTS

| | | |
|---|---|---|
| JP | 2002-539604 A | 11/2002 |
| JP | 2003-517727 A | 5/2003 |
| JP | 2003-272998 A | 9/2003 |
| JP | 2004-304097 A | 10/2004 |
| JP | 2005-533393 | 11/2005 |
| JP | 2006-126301 A | 5/2006 |
| WO | WO 00/54107 A1 | 9/2000 |
| WO | WO 01/33300 A2 | 5/2001 |
| WO | WO 2004/016406 | 2/2004 |
| WO | WO 2004/114382 | 12/2004 |
| WO | WO 2005091073 A1 * | 9/2005 |

OTHER PUBLICATIONS

International Search Report issued in corresponding PCT Application No. PCT/JP2007/060956.

Decision for Rejection issued in Japanese Patent Application No. 2006-1588944 on May 15, 2012.

* cited by examiner

FIG. 1A
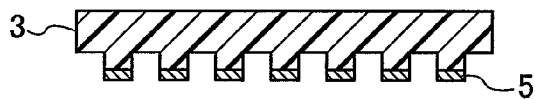
FIG. 1B
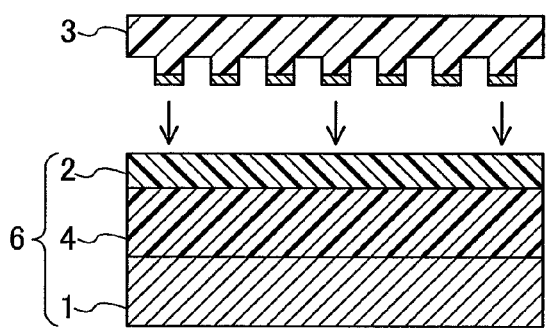
FIG. 1C
FIG. 1D
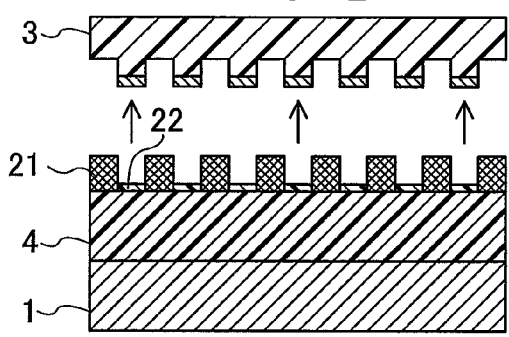
FIG. 1E
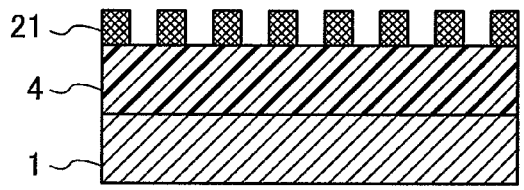
FIG. 1F
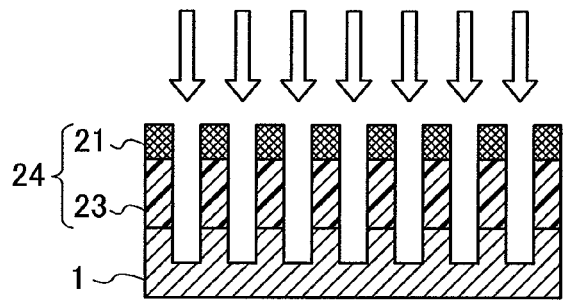
FIG. 1G

METHOD OF FORMING RESIST PATTERN BY NANOIMPRINT LITHOGRAPHY

RELATED APPLICATIONS

This application is the U.S. National Phase filing under 35 U.S.C. §371 of PCT/JP2007/060956, filed May 30, 2007, which designated the United States and was published in a language other than English, which claims priority under 35 U.S.C. §119(a)-(d) to Japanese Patent Application No. 2006-158894, filed Jun. 7, 2006. The content of these applications is incorporated herein by reference in their entireties.

TECHNICAL FIELD

The present invention relates to a method of forming a resist pattern by nanoimprint lithography. More particularly, the present invention relates to a method of forming a resist pattern using nanoimprint lithography, by forming a resist layer using a chemically amplified negative-type resist composition.

BACKGROUND ART

Lithography techniques have been used as a core technology in semiconductor device processes, and with recent advancement in highly integrated semiconductor integrated circuits (IC), exceedingly finer wiring patterns have been formed. Method of miniaturization are generally: use of a light source of shorter wavelength, such as shortening wavelength of light source using, for example, a KrF excimer laser, an ArF excimer laser, an $F_2$ laser, an EUV (extreme ultraviolet) light, an EB (electron beam), or an X-ray; increasing numerical aperture (NA) of a lens of an exposure apparatus (increased NA); and the like. However, the shortening of wavelength of the light sources requires a new expensive exposure apparatus.

Under such circumstances, nanoimprint lithography using a negative resist composition (hereinafter also referred to as photo-nanoimprint lithography) was proposed (see Non-Patent Document 1). In this process, a light transmissive mold having a light-resistant portion in part is pressed against a resist layer formed by using a negative resist composition; subsequently, ultra-violet light is irradiated to cure the resin, and the mold is detached therefrom, thereby obtaining a pattern. The aforementioned photo-nanoimprint lithography allows for formation of a fine resist pattern without requiring an expensive device. This can also eliminate the problem of conventional nanoimprint lithography, in that resist film remains as a residue on a portion against which a convex portion of a mold has been pressed.

Non-Patent Document 1: Proceedings of SPIE, Vol. 5374, p. 337-347 (2004)

DISCLOSURE OF THE INVENTION

Problems to be Solved by the Invention

However, in a case where the aforementioned photo-nanoimprint lithography is used, though a fine resist pattern can be formed, pattern collapse may occur subsequently in a development step or a rinsing step when a resist pattern of a high aspect ratio is to be formed. On the other hand, in a case where a thin resist film is used to avoid pattern collapse, sufficient etching resistance cannot be obtained.

Means for Solving the Problems

In order to solve the abovementioned problems, the present inventors have conducted extensive studies. As a result, the present inventors have completed the present invention based on the discovery that a bi-layer resist process using a chemically amplified negative resist composition containing a particular silsesquioxane resin (A) can solve the abovementioned problems. More specifically, the present invention provides the following.

The present invention is a method of forming a resist pattern by nanoimprint lithography, including steps of: forming an organic layer on a support substrate; forming a resist layer on the organic layer by using a chemically amplified negative resist composition containing a silsesquioxane resin (A); after pressing a mold of light transmissive type partially having a light-resistant portion against the resist layer, exposing from above the mold; and detaching the mold.

Effects of the Invention

In the method of forming a resist pattern of the present invention using nanoimprint lithography, a resist pattern is formed by a bi-layer resist process using a chemically amplified negative resist composition containing a silsesquioxane resin (A), thereby providing superior etching resistance even in a case where a thin film is used.

BRIEF DESCRIPTION OF THE DRAWINGS

FIG. 1A-1G is a diagram showing steps of nanoimprint lithography in a bi-layer resist process.

PREFERRED MODE FOR CARRYING OUT THE INVENTION

A method of forming a resist pattern by nanoimprint lithography, as an embodiment of the present invention, is described hereinafter with reference to the drawing. The method of forming a resist pattern by nanoimprint lithography of the present invention includes steps of: forming an organic layer on a support substrate; forming a resist layer on the organic layer by using a chemically amplified negative resist composition containing a silsesquioxane resin (A); after pressing a mold of light transmissive type partially having a light-resistant portion against the resist layer, exposing from above the mold; and detaching the mold.

FIG. 1A-1G is a process chart of photo-nanoimprint lithography using a bi-layer resist process.

Photo-Nanoimprint Lithography Using a Bi-Layer Resist Process

An embodiment of photo-nanoimprint lithography using a bi-layer resist process is described hereinafter.

First, an organic layer is formed on a support substrate 1. There are no particular limitations as the support substrate 1, and conventionally known materials can be used; for example, an electronic substrate, an electronic substrate on which a predetermined wiring pattern is formed, and the like can be exemplified. As the substrate, for example, a silicon wafer, a substrate made of metal such as copper, chrome, iron, aluminum or the like, a glass substrate, and the like can be exemplified. As the material of the wiring pattern, for example, copper, aluminum, nickel, gold or the like are available.

The organic layer 4 is consisted of an organic film, which is insoluble in an alkali developer used in development after exposure, and which can be etched by a conventional dry etching method. An organic film material for forming the organic layer 4 is not necessarily photosensitive as the resist layer formed thereabove. A resist material or a resin material, which has been generally employed as a base material in the manufacture of semiconductor elements and liquid crystal display elements, can be used.

The organic layer 4 is preferably a material that can be etched by oxygen plasma. As such a material for forming the organic film, one containing as a principal component at least one selected from the group consisting of novolak resin, acrylic resin and soluble polyimide is preferably used, which can be easily etched by oxygen plasma and is highly resistant to fluorocarbon gas used in a subsequent step for etching a silicon substrate and the like. In particular, novolak resin, and acrylic resin having an alicyclic site or an aromatic ring on the side chain are preferably used since they have been universally used at low costs, and are excellent in resistance to dry etching performed in the subsequent step.

As the novolak resin, though a commercially available novolak resin can be used, a novolak resin having a mass average molecular weight (Mw) of 5000 to 50000, preferably of 8000 to 30000, and also has a low molecular weight component of a molecular weight of 500 or less, preferably 200 or less, whose content is 1% or less by mass, preferably 0.8% or less by mass, determined using gel permeation chromatography. The content of the low molecular weight component is preferably as low as possible, and is desirably 0% by mass.

Here, the "low molecular weight component of a molecular weight of 500 or less" is detected as a low-molecular fraction having a molecular weight of 500 or less when analyzed by a GPC method using polystyrene standards. The "low molecular weight component of a molecular weight of 500 or less" includes a non-polymerized monomer, and those having low polymerization degree, such as those obtained by condensing 2 to 5 molecules of phenols with aldehydes, although this varies depending on the molecular weight.

The content (% by mass) of the low molecular weight component of a molecular weight of 500 or less is measured by plotting a fraction number (abscissa) versus a concentration (ordinate) of the analysis results obtained by the GPC method to form a graph, and determining ratio (%) of the area under the curve of the low molecular weight component of a molecular weight of 500 or less to the entire area under the curve.

The novolak resin, as the organic film material, having a Mw of 50000 or less provides superior implantation characteristics into a substrate having subtle unevenness, while the novolak resin having a Mw of 5000 or more provides superior etching resistance to fluorocarbon gas and the like.

In addition, by defining the content of the low molecular weight component of molecular weight of 500 or less to be 1% or less by mass, superior implantation characteristics into a substrate having subtle unevenness can be provided. Although the grounds for the superior implantation characteristics provided by reducing the content of the oligomer are not clear, it is assumed to result from a lowered degree of dispersion.

As the acrylic resin for forming the organic layer 4, any one generally used in photoresist compositions can be used, for example, acrylic resins having a constitutional unit derived from a polymerizable compound having an ether linkage, and a constitutional unit derived from a polymerizable compound having a carboxyl group can be given.

The soluble polyimide, which constitutes the organic layer 4, is a polyimide that can be liquified by the organic solvent as described above.

The organic layer 4 can be formed by: applying a solution of material for forming thereof by using a spinner or the like; and bake processing thereto, preferably at baking conditions of 200 to 300° C. and 30 to 300 seconds, and more preferably for 60 to 180 seconds.

Subsequently, a resist laminate 6 shown in FIG. 1A is obtained by: applying a chemically amplified negative resist composition containing a silsesquioxane resin (A) (described later) onto the organic layer 4 by a spinner or the like; prebaking treatment is administered for about 0.5 to 60 minutes, preferably 40 to 180 seconds, more preferably 60 to 90 seconds under a temperature condition of 70 to 150° C., preferably 80 to 140° C., thereby forming a resist layer 2.

In the resist laminate 6, the thickness of the resist layer 2 in an upper portion and the organic layer 4 in a lower portion, as a total, is preferably 15 μm or less, and more preferably 6 μm or less, based on the balance with throughput with respect to an intended aspect ratio of resist pattern and the time period required for dry etching of the organic layer 4. Although the lower limit of the total thickness is not particularly limited, it is preferably 0.3 μm or more, and more preferably 0.35 μm or more.

Thickness of the resist layer 2 in the upper portion is preferably 10 to 200 nm, and more preferably 30 to 150 nm. Making the thickness of the resist layer 2 within this range leads to effects such as that a resist pattern with high resolution can be formed and sufficient resistance to the dry etching is obtained.

Thickness of the organic layer 4 in the lower portion is preferably 100 to 14000 nm, and more preferably 300 to 5000 nm. Making the thickness of the organic layer 4 within this range leads to effects such as that a resist pattern with a high aspect ratio can be formed, and sufficient etching resistance upon etching of the substrate can be ensured.

It should be noted that, an organic or inorganic anti-reflection film may be provided between the organic layer 4 and the resist layer 2.

Next, after pressing a mold 3 of light transmissive type partially having a light-resistant portion 5 against the above-obtained resist laminate 6 as shown in FIG. 1B, exposure is carried out from above the mold 3 as shown in FIG. 1C. As a light source for the exposure, there are no particular limitations, and any radiation may be applied such as KrF excimer laser, ArF excimer laser, $F_2$ laser, EUV (Extreme Ultra Violet), VUV (Vacuum Ultra Violet), X-ray, soft X-ray, and the like. The light-resistant portion 5 is preferably at an apex of a convex portion of the mold. Material of the light-resistant portion 5 is not particularly limited as long as it can block light transmittance. More specifically, metal such as chrome, nickel, aluminum, gold, silver, copper, germanium, selenium, titanium, tin, zinc and the like can be exemplified. Chrome and nickel are particularly preferably used among these.

Subsequently, PEB (post-exposure baking) is conducted under a temperature condition of 70 to 130° C. for 40 to 180 seconds, and preferably 60 to 90 seconds.

Next, the mold 3 is detached as shown in FIG. 1D, and a development process is performed by using an alkaline developer, for example, an aqueous tetramethylammonium hydroxide solution of 0.05% to 10% by mass, and preferably of 0.05% to 3% by mass. Thereafter, by sufficiently performing a rinsing treatment, a drying treatment and the like, an upper resist pattern 21 is formed, as shown in FIG. 1E. It should be noted that, resist residue 22 is dissolved and removed by the alkaline developer, since ultraviolet rays are blocked by the light-resistant portion 5.

Next, as shown in FIG. 1F, the organic layer 4 is dry etched by using the upper resist pattern 21 obtained as a mask pattern, thus forming a lower resist pattern 23 on the organic layer 4.

As a dry etching method, a known method can be used such as chemical or physical etching, e.g., chemical etching such as down flow etching or chemical dry etching; physical etching such as sputter etching or ion beam etching; RIE (reactive ion etching); or the like.

Most common dry etching is parallel plate type RIE. In this method, the resist laminate is first placed in a chamber of an RIE apparatus, and then a required etching gas is introduced. When a high-frequency voltage is applied to a holder of the resist laminate placed parallel to an upper electrode in the chamber, the gas is turned into plasma. In the plasma, charged particles such as positive/negative ions and electrons, as well as neutral active species are present. When these etching species are adsorbed on the lower organic layer, a chemical reaction is caused, whereby the reaction products are released from the surface and discharged outside, advancing the etching.

Oxygen, sulfur dioxide and the like can be used as etching gas; however, oxygen is used preferably because oxygen plasma etching provides high-resolution, the resist layer containing a silsesquioxane resin (A) has a high etching resistance to oxygen plasma, and the like.

Since a resist pattern 24 is obtainable in which the upper resist pattern 21 and the lower resist pattern 23 are laminated, by using the this as a mask, a micropattern 25 is formed on the support substrate 1 by performing etching (FIG. 1G).

As an etching method for this case, an etching method using a halogen-based gas can be preferably used.

In the aforementioned method for forming a resist pattern, the upper resist pattern 21 is first formed by carrying out exposure, pattern transfer and alkaline development by photo-nanoimprint lithography, and then the organic layer 4 is dry etched using the upper resist pattern 21 as a mask, thereby transferring a pattern of the resist layer (the upper resist pattern 21) to the organic layer 4. As a result, a resist pattern 24 of a high aspect ratio can be formed without pattern collapse occurring.

In addition, since the resist pattern is formed by using the resist laminate 6 in which the lower organic layer 4 and the upper resist layer 2 are laminated, even though a pattern with a high aspect ratio is to be formed, the resist layer 2 can be a thin film. Generally, thinning of the resist layer improves resolution, and, at the same time, lowers etching resistance; however, the resist layer used in the present invention, formed by using a chemically amplified negative resist composition containing a silsesquioxane resin (A), has a superior etching resistance even in a case of being a thin film, and thus allows for formation of a resist pattern of a high aspect ratio.

Chemically Amplified Negative Resist Composition Containing Silsesquioxane Resin (A)

A chemically amplified negative resist composition containing a silsesquioxane resin (A) used in the method for forming a resist pattern of the present invention is described hereinafter. More specifically, the chemically amplified negative resist composition used in the present invention contains: a silsesquioxane resin (hereinafter also referred to as component (A)); an acid generator (B) (hereinafter also referred to as component (B)); and a cross-linking agent (C) (hereinafter also referred to as component (C)).

In such a negative resist composition, acid is generated from the component (B) by ultraviolet irradiation, the component (A) and the component (C) are cross-linked by an effect of the acid, and an exposed portion changes from being alkali-soluble to being alkali-insoluble.

Component (A)
Silsesquioxane Resin

A silsesquioxane resin is preferably alkali-soluble.

The silsesquioxane resin (A) includes a resin having a constituent unit (a1) represented by the following general formula (a-1). The constituent unit (a1) may be used solely or in combination of two or more thereof.

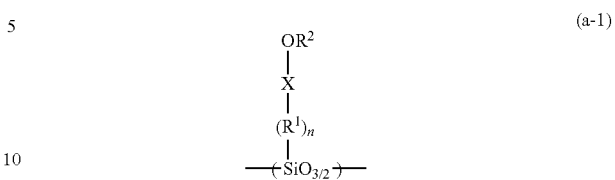

(In the formula, X represents an alkylene group having 1 to 15 carbon atoms or a divalent aromatic hydrocarbon group having 6 to 15 carbon atoms; $R^1$ represents an alkylene group having 1 to 5 carbon atoms; $R^2$ represents a hydrogen atom, an alkyl group having 1 to 5 carbon atoms, or an alkoxyalkyl group having 1 to 5 carbon atoms; and n is 0 or 1.)

X represents an alkylene group having 1 to 15 carbon atoms or a divalent aromatic hydrocarbon group having 6 to 15 carbon atoms. As the alkylene group having 1 to 15 carbon atoms, linear, branched, or cyclic alkylene groups can be exemplified.

As the linear or branched alkylene group, preferably having 1 to 6 carbon atoms, a methyl group, an ethyl group, an n-propyl group, an i-propyl group, an n-butyl group, a tert-butyl group and the like, from which one hydrogen atom is removed, can be exemplified.

The cyclic alkylene group preferably has 4 to 15 carbon atoms, more preferably 4 to 12 carbon atoms, and most preferably 5 to 10 carbon atoms. More specifically, groups each obtained by removing at least two hydrogen atoms from monocycloalkane or polycycloalkane such as bicycloalkane, tricycloalkane, tetracycloalkane and the like, which may be substituted or not substituted with a fluorine atom or a fluorinated alkyl group, can be exemplified. More specifically, groups such as: monocycloalkanes such as cyclopentane, cyclohexane and the like; and polycycloalkanes such as adamantane, norbornane, isobornane, tricyclodecane, tetracyclododecane and the like, from which at least two hydrogen atoms are removed, can be exemplified.

As the divalent aromatic hydrocarbon group, groups obtained by removing one hydrogen atom from a naphthyl group, a phenyl group, an anthracenyl group and the like can be exemplified, and a group obtained by removing one hydrogen atom from a phenyl group is preferred.

$R^1$ is an alkylene group having 1 to 5 carbon atoms, which can be exemplified by a methyl group, ethyl group, an n-propyl group, an i-propyl group, an n-butyl group, a tert-butyl group and the like, from which one hydrogen atom is removed.

$R^2$ represents a hydrogen atom, an alkyl group having 1 to 5 carbon atoms, or an alkoxyalkyl group having 1 to 5 carbon atoms.

As the alkyl group having 1 to 5 carbon atoms of $R^2$, a methyl group, an ethyl group, an n-propyl group, an i-propyl group, an n-butyl group, and a tert-butyl group can be exemplified, and a methyl group is preferable.

As the alkoxyalkyl group having 1 to 5 carbon atoms of $R^2$, a 1-ethoxyethyl group, 1-ethoxymethyl group, 1-methoxyethyl group, 1-methoxymethyl group, 1-methoxypropyl group, 1-ethoxypropyl group and the like can be exemplified, and the 1-ethoxyethyl group is preferable.

Among these, a hydrogen atom or a methyl group is preferable.

n is 0 or 1, and preferably 1. However, in a case where X is a linear or branched alkylene group, n is 0.

A proportion of the constituent unit (a1) with respect to all the constituents of the component (A) is preferably 10 to 95% by mole, more preferably 30 to 90% by mole, especially preferably 50 to 85% by mole, and most preferably 60 to 80% by mole. In the abovementioned proportion, superior alkali solubility can be obtained and a fine resist pattern can be formed.

The component (A) preferably further includes a constituent unit (a2) represented by the following general formula (a-2).

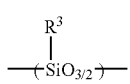
(a-2)

(In the formula, $R^3$ represents an alkyl group having 1 to 15 carbon atoms or an aromatic hydrocarbon group having 6 to 15 carbon atoms.)

$R^3$ represents an alkyl group having 1 to 15 carbon atoms or an aromatic hydrocarbon group having 6 to 15 carbon atoms. Linear, branched, or cyclic alkyl groups can be exemplified as the alkyl group having 1 to 15 carbon atoms.

As the linear or branched alkyl group, preferably having 1 to 6 carbon atoms, a methyl group, an ethyl group, an n-propyl group, an i-propyl group, an n-butyl group, a tert-butyl group and the like can be exemplified.

The cyclic alkyl group preferably has 4 to 15 carbon atoms, more preferably 4 to 12 carbon atoms, and most preferably 5 to 10 carbon atoms. More specifically, groups each obtained by removing at least one hydrogen atom from monocycloalkane or polycycloalkane such as bicycloalkane, tricycloalkane, tetracycloalkane and the like, which may be substituted or not substituted with a fluorine atom or a fluorinated alkyl group, can be exemplified. More specifically, groups such as: monocycloalkanes such as cyclopentane, cyclohexane and the like; and polycycloalkanes such as adamantane, norbornane, isobornane, tricyclodecane, tetracyclododecane and the like, from which at least one hydrogen atom is removed, can be exemplified.

As the divalent aromatic hydrocarbon group, a naphthyl group, a phenyl group, an anthracenyl group, a benzyl group and the like can be exemplified, and a phenyl group is preferred.

A proportion of the constituent unit (a2) with respect to all the constituents of the component (A) is preferably 1 to 50% by mole, more preferably 5 to 40% by mole, especially preferably 10 to 40% by mole, and most preferably 15 to 35% by mole. In the abovementioned range, heat resistance is improved. In addition, a dissolution rate by an alkaline developing solution can be adjusted.

In the present invention, a constituent unit other than the constituent unit (a1) and the constituent unit (a2) can be contained.

Mass average molecular weight (Mw) of the component (A) is, though not particularly limited, and preferably in a range of 1000 to 20000. A range of 2000 to 15000 is more preferable. In the abovementioned range, superior solubility in an organic solvent and a developer can be obtained.

In addition, a degree of dispersion (Mw/Mn) thereof is, though not particularly limited, preferably 1.0 to 6.0, and more preferably 1.0 to 2.0.

As the component (A), more specifically, at least one selected from the following chemical formulae (A-1) to (A-6) is preferred.

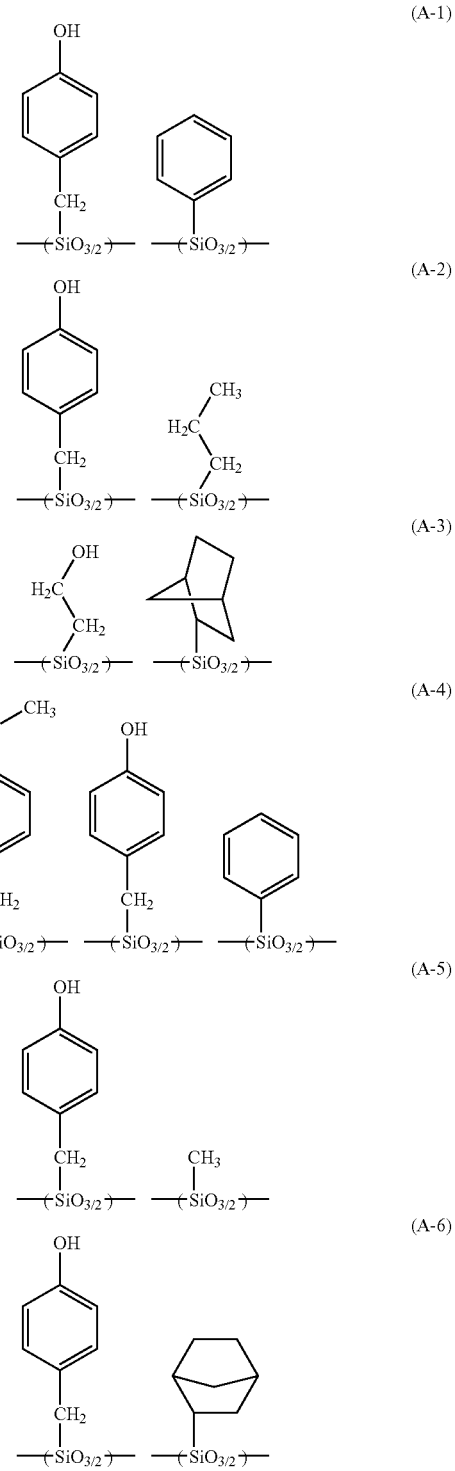

Component (B)
Acid Generator

In the present invention, an acid generator is not particularly limited and can be selected from well known acid generators utilized in conventional chemically amplified resist composition. As such an acid generator, a wide variety thereof is conventionally known such as: onium salt based acid generators such as iodonium salts and sulfonium salts; oxime-sulfonate based acid generators; diazomethane based acid generators such as bisalkyl or bisaryl sulfonyl diazomethanes, poly(bissulfonyl)diazomethanes and diazomethanenitrobenzyl sulfonates; iminosulfonate based acid generators; disulfone based acid generators; and the like.

As specific examples of the onium salt based acid generators, trifluoromethanesulfonate or nonafluorobutanesulfonate of diphenyliodonium; trifluoromethanesulfonate or nonafluorobutanesulfonate of bis(4-tert-butylphenyl)iodonium; trifluoromethanesulfonate, heptafluoropropanesulfonate or nonafluorobutanesulfonate of triphenylsulfonium; trifluoromethanefulfonate, heptafluoropropanesulfonate or nonafluorobutanesulfonate of tri(4-methylphenyl)sulfonium; trifluoromethanesulfonate, heptafluoropropanesulfonate or nonafluorobutanesulfonate of dimethyl(4-hydroxynaphthyl)sulfonium; trifluoromethanesulfonate, heptafluoropropanesulfonate or nonafluorobutanesulfonate of monophenyldimethylsulfonium; trifluoromethanesulfonate, heptafluoropropanesulfonate or nonafluorobutanesulfonate of diphenylmonomethylsulfonium; the following chemical formulae (B)-1 and (B)-2; and the like can be given.

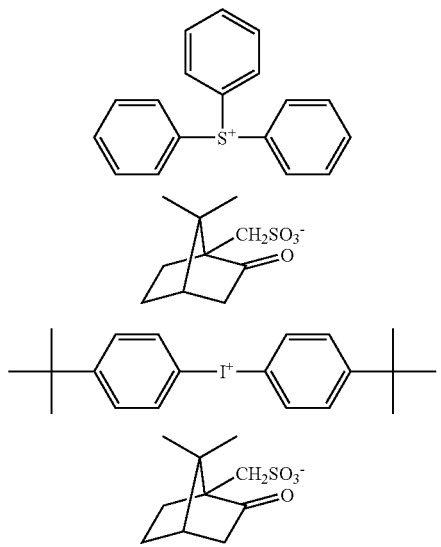

(B)-1

(B)-2

As specific examples of the oximesulfonate based acid generators include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, α-(methylsulfonyloxyimino)-p-bromophenylacetonitrile, bis-O-(n-butylsulfonyl)-α-dimethylglyoxime, and the like can be given. Among these, α-(methylsulfonyloxyimino)-p-methoxyphenylacetonitrile and bis-O-(n-butylsulfonyl)-α-dimethylglyoxime are preferred.

As specific examples of bisalkyl or bisaryl sulfonyl diazomethanes among the diazomethane based acid generators, bis(isopropylsulfonyl)diazomethane, bis(p-toluenesulfonyl)diazomethane, bis(1,1-dimethylethylsulfonyl)diazomethane, bis(cyclohexylsulfonyl)diazomethane, bis(2,4-dimethylphenylsulfonyl)diazomethane, and the like can be given.

In addition, as the poly(bissulfonyl)diazomethanes, for example, 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, 1,10-bis(cyclohexylsulfonyldiazomethylsulfonyl)decane, and the like can be given.

As the component (B), a single acid generator may be used alone, or two or more acid generators may be used in combination. In addition, the content of the acid-generator with respect to 100 parts by mass of the component (A) is 0.5 to 30 parts by mass, and preferably 1 to 15 parts by mass. By making abovementioned range, sufficient pattern forming is performed.

Component (C)
Cross-linking Agent

A cross-linking agent is not particularly limited and can be arbitrarily selected and used from well-known cross-linking agents which have been used for chemically amplified negative resist compositions.

More specifically, for example, aliphatic cyclic hydrocarbons or oxygen-containing derivatives thereof, having a hydroxyl group or a hydroxyalkyl group, or both thereof, such as 2,3-dihydroxy-5-hydroxymethyl norbornane, 2-hydroxy-5,6-bis(hydroxymethyl) norbornane, cyclohexane dimethanol, 3,4,8 (or, 9)-trihydroxy tricyclodecane, 2-methyl-2-adamantanol, 1,4-dioxane-2,3-diol, and 1,3,5-trihydroxycyclohexane and the like can be exemplified.

In addition, compounds prepared by reacting any of amino group-containing compounds such as melamine, acetoguanamine, benzoguanamine, urea, ethylene urea, propylene urea and glycoluril with formaldehyde, or with formaldehyde and lower alcohol, thereby substituting a hydrogen atom of the amino group with a hydroxymethyl group or a lower alkoxymethyl group can be exemplified. Among these, a compound using melamine is called a melamine type cross-linking agent, a compound using urea is called a urea type cross-linking agent, a compound using alkylene urea such as ethylene urea, propylene urea and the like is called an alkylene urea type cross-linking agent, and a compound using glycoluril is called a glycoluril type cross-linking agent. The cross-linking agent is preferably at least one selected from a group consisting of a melamine type cross-linking agent, a urea type cross-linking agent, an alkylene urea type cross-linking agent, and a glycoluril type cross-linking agent and especially preferably a glycoluril type cross-linking agent.

As the melamine type cross-linking agent, a compound prepared by reacting melamine with formaldehyde and thereby substituting a hydrogen atom of the amino group with a hydroxymethyl group, a compound prepared by reacting melamine with formaldehyde and lower alcohol and thereby substituting a hydrogen atom of the amino group with a lower alkoxymethyl group and the like can be exemplified. More preferably, hexamethoxymethyl melamine, hexaethoxymethyl melamine, hexapropoxymethyl melamine, hexabutoxybutyl melamine and the like are exemplified, and, among these, hexamethoxymethyl melamine is preferred.

As the urea type cross-linking agent, a compound prepared by reacting urea with formaldehyde and thereby substituting a hydrogen atom of the amino group with a hydroxymethyl group, a compound prepared by reacting urea with formaldehyde and lower alcohol and thereby substituting a hydrogen atom of the amino group with a lower alkoxymethyl group and the like can be exemplified. More specifically, bismethoxymethyl urea, bisethoxymethyl urea, bispropoxymethyl urea, bisbutoxymethyl urea and the like are exemplified, and, among these, bismethoxymethyl urea is preferred.

As the alkylene urea type cross-linking agent, a compound represented by the following general formula (c-1) can be exemplified.

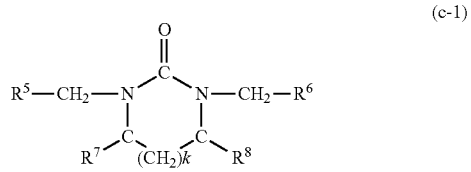

(c-1)

(In the formula, $R^5$ and $R^6$ are each independently a hydroxyl group or a lower alkoxy group; $R^7$ and $R^8$ are each independently a hydrogen atom, a hydroxyl group or a lower alkoxy group; and k is an integer of 0 to 2.)

In a case where $R^5$ and $R^6$ are lower alkoxy groups, they are preferably alkoxy groups having 1 to 4 carbon atoms, and can be either linear or branched. $R^5$ and $R^6$ may be the same or different from each other, but are more preferably the same.

In a case where $R^7$ and $R^8$ are lower alkoxy groups, they are preferably alkoxy groups having 1 to 4 carbon atoms and can be either linear or branched. $R^7$ and $R^8$ may be the same or different from each other, but are more preferably the same.

K is an integer of 0 to 2, and preferably is 0 or 1.

As the alkylene urea type cross-linking agent, especially, a compound in which k is 0 (ethylene urea type cross-linking agent) and/or a compound in which k is 1 (propylene urea type cross-linking agent) is preferred.

A compound represented by the above general formula can be obtained by a condensation reaction of alkylene urea with formalin, or by further reacting a product thereof with a lower alcohol.

As specific examples of the alkylene urea type cross-linking agent, for example, an ethylene urea type cross-linking agent such as mono- and/or dihydroxymethylated ethylene urea, mono- and/or dimethoxymethylated ethylene urea, mono- and/or diethoxymethylated ethylene urea, mono- and/or dipropoxymethylated ethylene urea, and mono- and/or dibutoxymethylated ethylene urea; a propylene urea type cross-linking agent such as mono- and/or dihydroxymethylated propylene urea, mono- and/or dimethoxymethylated propylene urea, mono- and/or diethoxymethylated propylene urea, mono- and/or dipropoxymethylated propylene urea, and mono- and/or dibutoxymethylated propylene urea; 1,3-di(methoxymethyl)-4,5-dihydroxy-2-imidazolidinone; 1,3-di(methoxymethyl)-4,5-dimethoxy-2-imidazolidinone; and the like can be given.

As the glycoluril type cross-linking agent, a glycoluril derivative in which N-position is substituted by one or both of a hydroxyalkyl group and an alkoxyalkyl group having 1 to 4 carbon atoms. Such a glycoluril derivative can be obtained by a condensation reaction of glycoluril with formalin, or by further reacting a product thereof with a lower alcohol.

As specific examples of the glycoluril cross-linking agent, for example, mono-, di-, tri-, and/or tetrahydroxymethylated glycoluril, mono-, di-, tri-, and/or tetramethoxymethylated glycoluril, mono-, di-, tri-, and/or tetraethoxymethylated glycoluril, mono-, di-, tri-, and/or tetrapropoxymethylated glycoluril, mono-, di-, tri-, and/or tetrabutoxymethylated glycoluril, and the like can be given.

As the cross-linking agent, a single kind thereof may be used independently, or two or more kinds thereof may be used in combination.

The content of the cross-linking agent with respect to 100 parts by mass of the component (A) is preferably 3 to 30 parts by mass, more preferably 3 to 15 parts by mass, and most preferably 5 to 10 parts by mass. If the content of the cross-linking agent is the lower limit or more, cross-linkage progresses sufficiently and a superior resist pattern can be obtained. In addition, if the content of the cross-linking agent is the upper limit or less, storage stability of the resist coating solution is superior and degradation in sensitivity thereof can be suppressed.

Component (D)
Nitrogen-Containing Organic Compound

In the chemically-enhanced negative resist composition used in the present invention, in order to improve resist pattern configuration and post exposure temporal stability, a nitrogen-containing organic compound may be additionally incorporated therein.

A wide variety of nitrogen-containing organic compound has already been proposed, and an arbitrarily selected compound from known compounds can be used; however, amines, in particular, secondary aliphatic amines and tertiary aliphatic amines, are preferably used.

As specific examples of the nitrogen-containing organic compound, alkylamines such as trimethylamine, diethylamine, triethylamine, di-n-propylamine, tri-n-propylamine, tripentylamine, tri-n-heptylamine, tri-n-octylamine, di-n-heptylamine, di-n-octylamine, tri-n-dodecylamine and the like; and alkyl alcohol amines such as diethanolamine, triethanolamine, diisopropanolamine, triisopropanolamine, di-n-octanolamine, tri-n-octanolamine and the like can be given.

These may be used independently or in combinations of two or more. In addition, the nitrogen-containing organic compound is used in an amount of 0.01 to 5.0 parts by mass, with respect to 100 parts by mass of the component (A).

Component (E)
Organic Carboxylic Acid or Phosphorus Oxo Acid or Derivative Thereof In addition, in order to prevent degradation in sensitivity due to the nitrogen-containing organic compound, to improve resist patterns configuration, and to enhance post exposure stability, an organic carboxylic acid or phosphorus oxo acid or derivative thereof may be additionally incorporated as an optional component. Moreover, the component (E) may be used in combination with the nitrogen-containing organic compound, or any one thereof can be used.

As the organic carboxylic acid, for example, malonic acid, citric acid, malic acid, succinic acid, benzoic acid, salicylic acid and the like are preferable.

As the phosphorus oxo acid or the derivative thereof, phosphoric acids and derivatives thereof such as esters thereof, such as phosphoric acid, phosphoric acid di-n-butyl ester, phosphoric acid diphenyl ester and the like; phosphonic acids and derivatives thereof such as esters thereof, such as phosphonic acid, phosphonic acid dimethyl ester, phosphonic acid-di-n-butyl ester, phenyl phosphonate, phosphonic acid diphenyl ester, phosphonic acid dibenzyl ester and the like; phosphinic acids and derivatives thereof such as esters thereof, such as phosphinic acid and phenyl phosphinate can be exemplified. Among these, phosphonic acid is particularly preferable.

Organic carboxylic acid or phosphorus oxo acid or a derivative thereof is utilized at a proportion of 0.01 to 5.0 parts by mass with respect to 100 parts by mass of the component (A).

Other Optional Components

The resist film composition used in the present invention may further contain accordingly, if desired, miscible additives such as additional resins to improve the properties of the resist film, surfactants to upgrade the coating properties, and plasticizers, stabilizers, colorants, and antihalation agents and the like.

Component (S)
Organic Solvent

The resist film composition according to the present invention may be prepared by dissolving any of the above components in an organic solvent.

As the organic solvent, any one that can dissolve each component used and make a homogeneous solution can be used, and any one or more solvents that are selected from a group of conventionally known solvents for chemically amplified resists can be used.

For example, ketones such as γ-butyrolactone, acetone, methyl ethyl ketone, cyclohexanone, methyl isoamyl ketone, 2-heptanone and the like; polyalcohols and derivatives thereof, such as ethylene glycol, ethylene glycol monoacetate, diethylene glycol, diethylene glycol monoacetate, propylene glycol, propylene glycol monoacetate, monomethyl ether of dipropylene glycol or dipropylene glycol monoacetate, monoethyl ether, monopropyl ether, monobutyl ether or monophenyl ether, and the like; cyclic ethers such as dioxane; and esters such as methyl lactate, ethyl lactate (EL), methyl acetate, ethyl acetate, butyl acetate, methyl pyruvate, ethyl pyruvate, methyl methoxy propionate, ethyl ethoxy propionate and the like can be exemplified.

The amount of the organic solvent used is not particularly limited, and is adjusted accordingly within a range of concentration that allows coating of a substrate and the like in accordance with coating film thickness; in general, an amount that makes the solid content of the resist composition be in a range of 2 to 20% by mass, and preferably of 5 to 15% by mass, is applied. Examples A chemically amplified negative resist composition was prepared by a composition shown in the following Table 1.

silsesquioxane=10/60/30 (molar ratio), mass average molecular weight 7000, dispersivity 1.8)

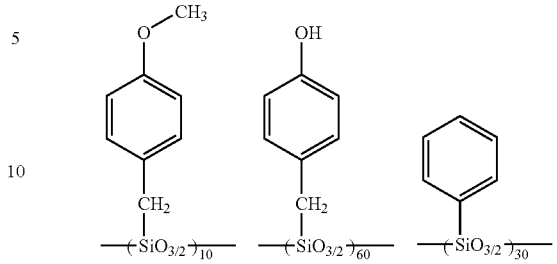

(A)-3: a copolymer of hydroxystyrene/styrene=75/25 (molar ratio) (mass average molecular weight 2500)

(B)-1: a compound represented by the following chemical formula

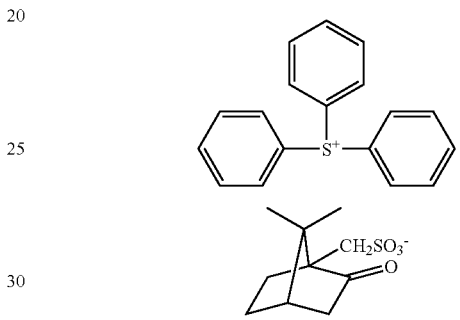

TABLE 1

|  | Component (A) |  | Component (B) | Component (C) | Component (D) | Component (E) | Component (S) |
|---|---|---|---|---|---|---|---|
| Example 1 | (A)-1 [100] |  | (B)-1 [3.96] | (C)-1 [12.0] | (D)-1 [0.4] | (E)-1 [0.33] | (S)-1 [2000] |
| Example 2 | (A)-1 [100] |  | (B)-2 [3.76] | (C)-1 [12.0] | (D)-1 [0.4] | (E)-1 [0.33] | (S)-1 [2000] |
| Example 3 | (A)-1 [80] | (A)-2 [20] | (B)-2 [5.0] | (C)-1 [12.0] | (D)-1 [0.4] | (E)-1 [0.33] | (S)-1 [2000] |
| Comparative Example 1 | (A)-3 [100] |  | (B)-2 [3.76] | (C)-1 [12.0] | (D)-1 [0.4] | (E)-1 [0.33] | (S)-1 [2000] |
| Comparative Example 2 | (A)-3 [100] |  | (B)-2 [3.76] | (C)-1 [12.0] | (D)-1 [0.4] | (E)-1 [0.33] | (S)-1 [2000] |

Reference symbols in Table 1 designate the following, respectively, and a numerical value between brackets ([ ]) is an amount thereof (by mass).

(A)-1: a resin represented by the following chemical formula (p-hydroxybenzylsilsesquioxane/phenylsilsesquioxane=70/30 (molar ratio), mass average molecular weight 7000, dispersivity 1.8)

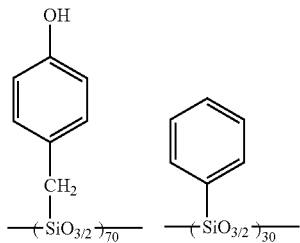

(A)-2: a resin represented by the following chemical formula (p-methoxybenzylsilsesquioxane/p-hydroxybenzyl- (B)-2: a compound represented by the following chemical formula

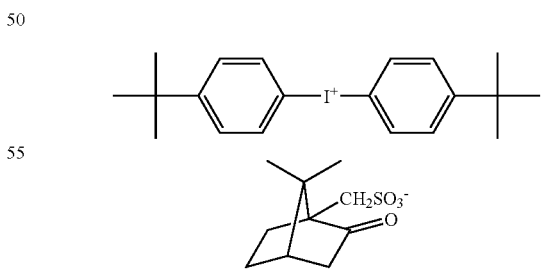

(C)-1: tetramethoxymethylated glycoluril (MX270, manufactured by Sanwa Chemical Co., Ltd.)

(D)-1: triisopropanolamine (E)-1: phenylphosphonic acid (S)-1: propylene glycol monomethyl ether

EXAMPLES 1 to 3

On an 8-inch silicon wafer on which a $SiO_2$ film was formed, a material for forming organic film "TBLC-100" (manufactured by Tokyo Ohka Kogyo Co., Ltd.) was coated, and then baked on a hot plate at 230° C. for 90 seconds, thus forming an organic film of 250 nm in thickness. The chemically-amplified negative resist compositions of examples 1 to 3 shown in Table 1 were applied respectively onto the organic film, and dried by pre-baking (PAB) on a hot plate at 100° C. for 90 seconds, thus forming a resist film of 150 nm in thickness. Thereafter, a mold of light transmissive type, which is partially light-resistant by chrome, was pressed against the resist film, and a KrF excimer laser (248 mm) was irradiated thereon by a KrF exposure device NSR-S203. Subsequently, PEB (post exposure bake) at 110° C. was carried out for 90 seconds, and the mold was released. Then, development was performed at 23° C. for 60 seconds, using an aqueous tetramethylammonium hydroxide (TMAH) solution of 2.38% by mass, followed by rinsing with water for 20 seconds and drying, thus forming a fine resist pattern having a rectangular shape without resist residue and pattern collapse.

Next, pattern transfer onto a lower layer film was performed by using $O_2$ plasma, with the resist pattern formed by using the chemically amplified negative resist compositions of Examples 1 to 3, respectively, as a mask. Then, by etching a $SiO_2$ film by using $CF_4$ based gas, with the pattern-formed lower layer film as a mask, a pattern of a superior shape (line width: 150 nm) could be obtained.

COMPARATIVE EXAMPLE 1

By carrying out exposure and development in a similar process to that of Example 1 using a chemically-amplified negative resist composition of Comparative Example 1, a rectangular shaped pattern was obtained after development, without residue in light-resistant portions of a mold. Subsequently, dry etching of a lower layer film by $O_2$ plasma was attempted, with the pattern-formed resist of Comparative Example 1 as a mask; however, the pattern could not be transferred to the lower layer film because the resist film was not resistant to $O_2$ plasma.

COMPARATIVE EXAMPLE 2

The chemically-amplified negative resist composition used in Comparative Example 1 was coated directly on an 8-inch silicon wafer, on which a $SiO_2$ film was formed, in a thickness of 400 nm. Thereafter, pattern forming was carried out in a similar method as in Example 1. For a pattern of at least 180 nm in line width, a superior shape without residue was obtained; however, for a pattern of no greater than 180 nm in line width, a symptom was observed where the pattern was collapsed.

The invention claimed is:
1. A method of forming a pattern, comprising the steps of:
forming an organic layer containing a novolak resin or an acrylic resin on a support substrate;
forming a resist layer on the organic layer with a chemically amplified negative resist composition containing a silsesquioxane resin, a cross-linking agent and an acid generator;
pressing a light transmissive type mold having a partially light-resistant portion against the resist layer;
exposing the resist layer from above the mold;
detaching the mold;
removing an uncured portion of the resist layer with a developer to form an upper resist pattern;
etching the organic layer using an oxygen plasma, with the upper resist pattern as a mask to form a lower resist pattern; and
forming a pattern on the support substrate by etching the support substrate with a fluorocarbon gas, using the upper resist pattern and the lower resist pattern as a mask, wherein
the silsesquioxane resin consists of one or more constituent units shown by the following general formula (a-1)

wherein, X represents an alkylene group having 1 to 15 carbon atoms or a divalent aromatic hydrocarbon group having 6 to 15 carbon atoms; $R^1$ represents an alkylene group having 1 to 5 carbon atoms; $R^2$ represents a hydrogen atom, and one or more constituent units shown by the following general formula (a-2)

wherein, $R^3$ represents an alkyl group having 1 to 15 carbon atoms or an aromatic hydrocarbon group having 6 to 15 carbon atoms, and wherein
the acid generator is represented by general formula (B-1) or (B-2):

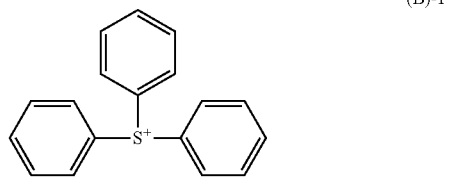

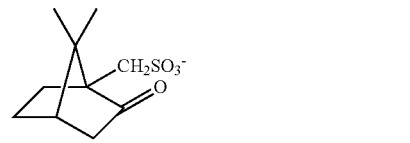

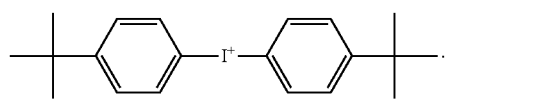

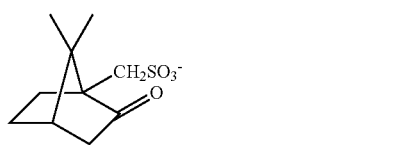

2. The method of forming a pattern according to claim 1, wherein the resist layer has a thickness of 10 to 200 nm.

3. The method of forming a pattern according to claim 1, wherein the light-resistant portion is a metallic thin film.

* * * * *